United States Patent
Verrett

Patent Number: 5,612,243
Date of Patent: Mar. 18, 1997

[54] POLYCIDE LOCAL INTERCONNECT METHOD AND STRUCTURE

[75] Inventor: Douglas P. Verrett, Sugarland, Tex.

[73] Assignee: Texas Instruments Incorporated, Dallas, Tex.

[21] Appl. No.: 933,595

[22] Filed: Aug. 20, 1992

Related U.S. Application Data

[63] Continuation of Ser. No. 557,245, Jul. 24, 1990, abandoned, which is a continuation of Ser. No. 377,696, Jul. 10, 1989, abandoned.

[51] Int. Cl.$^6$ .................................................. H01L 21/70
[52] U.S. Cl. ......................................... 437/57; 437/200
[58] Field of Search .......................... 437/192, 200, 437/40, 41, 44, 162, 34, 56, 57, 193; 257/377, 755

[56] References Cited

U.S. PATENT DOCUMENTS

| | | | |
|---|---|---|---|
| 4,102,733 | 7/1978 | DeLa Moneda et al. | 437/43 |
| 4,374,700 | 2/1983 | Scott et al. | |
| 4,392,150 | 7/1983 | Courreges | 437/913 |
| 4,476,482 | 10/1984 | Scott et al. | |
| 4,519,126 | 5/1985 | Hsu | |
| 4,593,454 | 6/1986 | Baudrant et al. | 148/DIG. 147 |
| 4,703,552 | 11/1987 | Baldi et al. | 437/45 |
| 4,735,916 | 4/1988 | Homma et al. | 437/162 |
| 4,740,479 | 4/1988 | Neppel et al. | 437/34 |
| 4,764,480 | 8/1988 | Vora | |
| 4,784,971 | 11/1988 | Chiu et al. | 437/162 |
| 4,786,611 | 11/1988 | Pfiester | |
| 4,804,636 | 2/1989 | Groover, III et al. | |
| 4,816,425 | 3/1989 | McPherson | 437/200 |
| 4,822,749 | 4/1989 | Flanner et al. | 437/41 |
| 4,851,257 | 7/1989 | Young et al. | 437/162 |
| 4,855,247 | 8/1989 | Ma et al. | |
| 4,873,204 | 10/1989 | Wong et al. | |
| 4,876,213 | 10/1989 | Pfiester | 437/200 |
| 4,877,755 | 10/1989 | Rodder | 437/200 |
| 5,066,995 | 11/1991 | Young et al. | |
| 5,124,280 | 6/1992 | Wei et al. | 437/193 |
| 5,278,098 | 1/1994 | Wei et al. | 437/193 |
| 5,294,822 | 3/1994 | Verrett | 257/368 |

FOREIGN PATENT DOCUMENTS

| | | | |
|---|---|---|---|
| 0091775 | 10/1983 | European Pat. Off. | 437/200 |
| 1281751 | 11/1989 | Japan | |

*Primary Examiner*—George Fourson
*Assistant Examiner*—Caridad Everhart
*Attorney, Agent, or Firm*—W. Daniel Swayze, Jr.; W. James Brady, III; Richard L. Donaldson

[57] ABSTRACT

A local interconnect comprises a doped, silicided amorphous or polysilicon layer 28. One interconnect 34, 35 extends between an isolated gate contact 60 and a source and drain 61 of an NMOS transistor 42. Another local interconnect 34, 37 extends between a source and a drain 62, 63 of CMOS transistors.

8 Claims, 2 Drawing Sheets

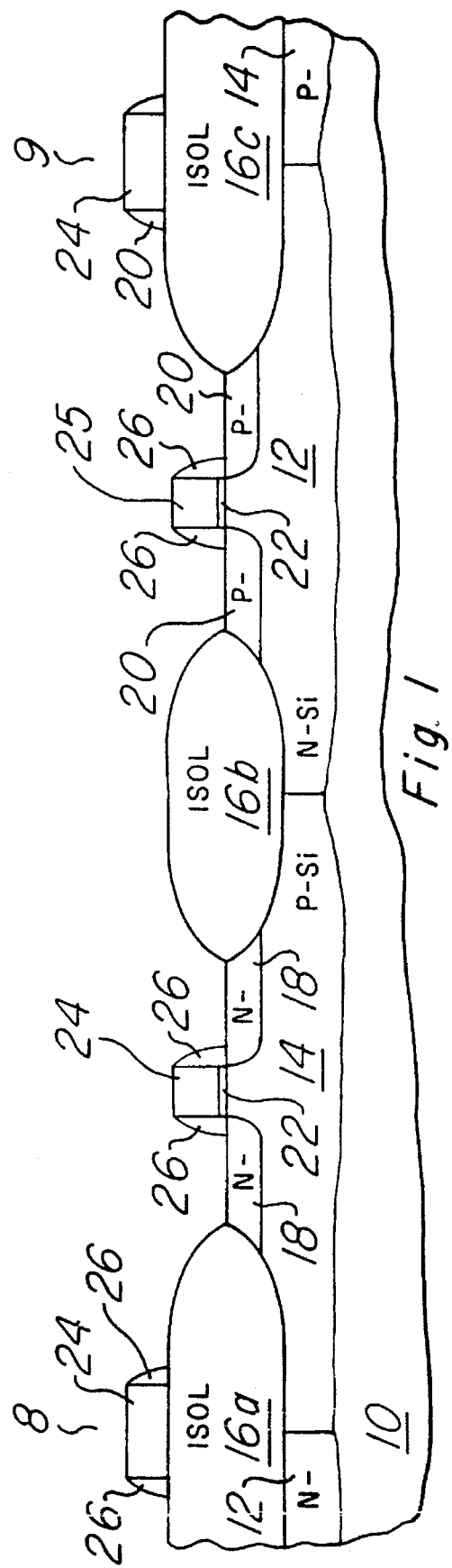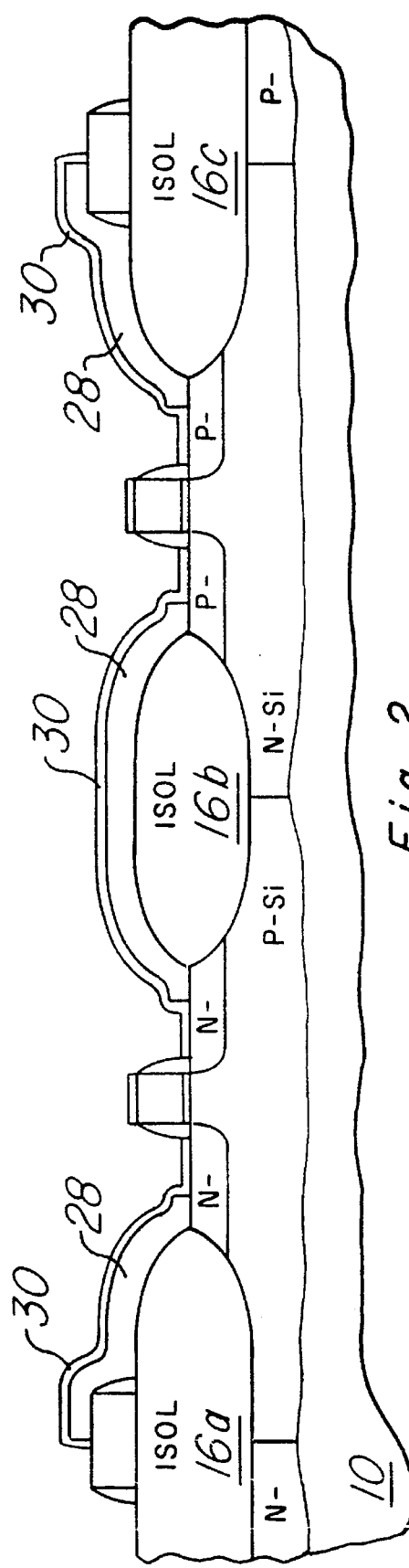

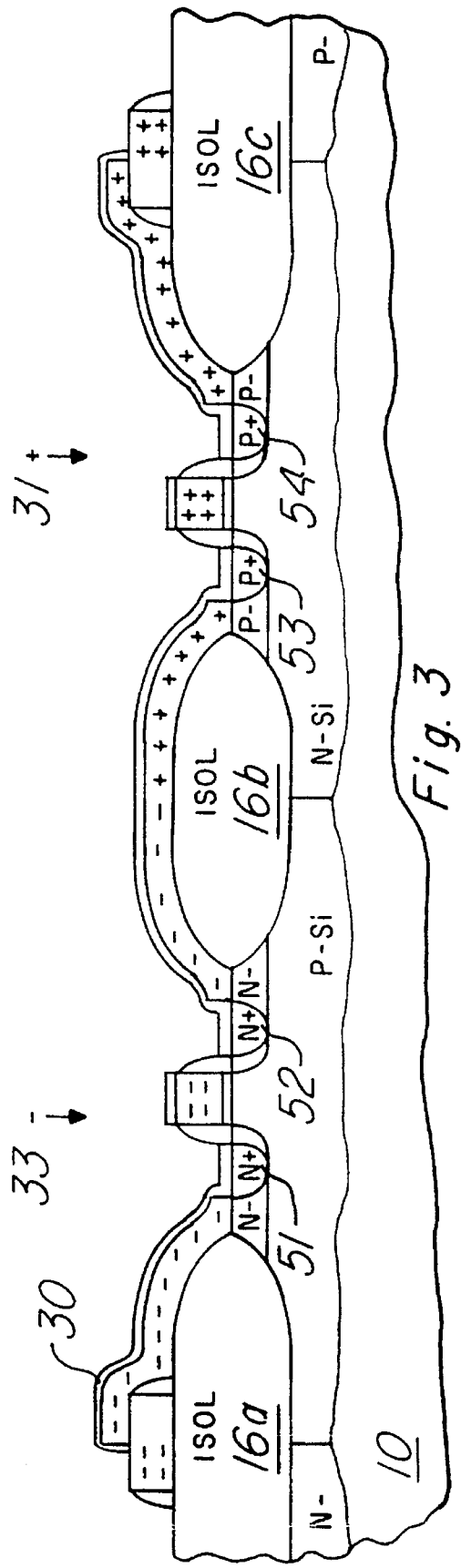
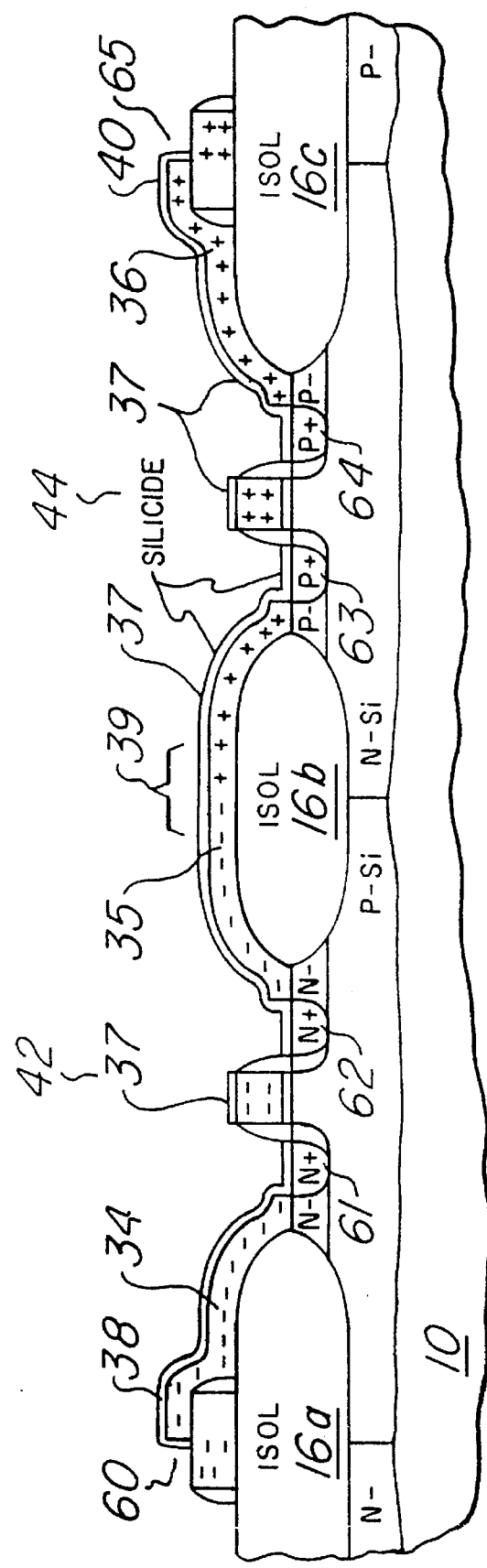
Fig. 3
Fig. 4

POLYCIDE LOCAL INTERCONNECT METHOD AND STRUCTURE

This application is a continuation of application Ser. No. 07/557,245 filed on Jul. 24, 1990, which is a continuation of application Ser. No. 07/377,696 filed Jul. 10, 1989, abandoned.

BACKGROUND

This invention relates in general to microelectronic circuits, and in particular, an interconnect structure and a method and apparatus for forming connections to microelectronic devices and between such devices.

The geometry of integrated circuits continues to shrink. At present, the distance between adjoining features in microelectronic devices is less than one micron. As CMOS gate lengths shrink, channel dopings must increase in order to maintain reasonable punchthrough voltages. With such increasing channel dopings, gate oxides are decreased in thickness, especially for faster gate switching and to maintain an approximately constant body effect. It is common in such CMOS technology to use polysilicon electrodes, usually N doped, with phosphorous, for forming the gate electrode. The work function of N+ polysilicon is about 4.05 electron volts which produces an accumulated surface charge on N type silicon resulting in larger than desired PMOS threshold. Another unwanted effect is the depleted surface on P type silicon which produces lower than desired NMOS thresholds. In order to increase the PMOS thresholds, a shallow boron implant is required. However, such counter doping produces a buried-channel type device that has poor turnoff subthreshold characteristics and is especially subject to short channel effects for submicron gate lengths.

In order to solve the above problems, in the past, others have used higher work function gate electrodes, for example, molybdenum (about 4.7 eV) or have proposed using P+ poly (about 5.25 eV) for PMOS devices. Another solution has been to lengthen the PMOS gate. However, lengthening the gate reduces the AC performance of the PMOS device which is already lower than its companion NMOS device.

It is known in CMOS technology to salicide polysilicon gates and sources and drains of CMOS devices. Such salicidation (simultaneously siliciding gates, sources and drains) reduces the resistance of these electrodes. With reduced resistance, devices can be made faster since the charging of the junctions and parasitic capacitance is done through smaller resistances.

The silicide of choice in many applications is titanium silicide. After the silicide process, unreacted titanium is conveniently reacted with a nitrogen-containing gas to form titanium nitride. Thus a thin layer of conductive titanium nitride (TIN) layer is suitable for forming local interconnects without a further deposition step. However, using TiN as a local interconnect has problems. First of all, its sheet resistance is marginal (4–40 ohms per square). For another, its formation process is sensitive to moisture and oxygen in the reaction chamber both of which are difficult to control. Also, resist adhesion is sometimes a problem, i.e., photoresist may not adhere to a TiN layer. It is often difficult to etch a TiN layer because of the low selectivity between a TiN layer and its underlying silicide. Underetch results in stringers or filaments which cause shorts; overetch erodes the silicide from the sources and drains causing high source-drain resistance.

Thus, there exists a problem in the current state of the art for forming a local interconnect which avoids the inherent problems associated with titanium nitride local interconnects and the penalties of using doped P implants that form buried P channel type devices.

SUMMARY

Applicant has discovered a solution to the foregoing problems. The solution includes a method for forming a local interconnect as well as a local interconnect structure. The method for forming a local interconnect on an insulated gate field effect transistor includes the steps of depositing a layer of amorphous silicon or polysilicon on the source or drain of a field effect transistor. The layer of non-monocrystalline silicon may be suitably doped N or P. Thereafter, that layer of non-monocrystalline silicon is silicided in order to provide a local electrical connection to the source or drain. Thus, the local interconnect includes a layer of silicided, non-monocrystalline silicon. The silicided layer of non-monocrystalline silicon is doped to the same conductivity type as the source and drain of the insulated gate field effect transistor that it contacts.

The interconnect structure can be formed between a gate contact and a source or drain terminal of an individual device or between source and drain contacts of complementary devices. Adjoining complementary MOS transistors are separated by field oxide isolation regions. The gate contacts are disposed on top of the isolation regions. Sidewall oxide spacers are formed on the gates and the gate contacts. Prior to depositing the non-monocrystalline layer of silicon, the sources, drains and gates are etched to remove any spacer oxide from their top surfaces. The uniform layer of non-monocrystalline silicon is deposited on the device. The layer is etched to the local interconnect pattern and oxidized to provide a thin protective layer. After oxidation, photoresist is applied for two separate implants. In a first implant, the PMOS device is masked and the NMOS device is suitably implanted in order to render the layer conductive, form a conductive gate, and form N+ regions in the source and drain of the NMOS device. Thereafter the photoresist is stripped and the NMOS device is masked in order to provide a further P+ implant to the PMOS device including its source, drain, gate, and the portions of the amorphous/poly local interconnect not already doped N-type.

After the P+ implant, the photoresist is removed and the sources, drains and interconnects are silicided to provide a local interconnect pattern.

It is believed that the siliciding operation will provide sufficient thermal energy to activate the implants. However, if a further annealing step is necessary for activation, one may be performed. Alternatively, the implant may be made through the silicide layer if so desired. The final structure will have a local interconnect between a gate contact and a source or drain, as well as a local interconnect between a source and a drain of adjoining CMOS devices. While the local interconnect between adjoining CMOS devices will have conductivities of opposite polarity, the latter is not expected to be a significant problem since the silicide layer on top of the polysilicon will provide a sufficiently conductive path to short out any junction effects. Alternatively, the masking pattern can be varied in order to reduce the number of dopants in the junction region of the interconnect.

Having thus briefly described the invention, further reference is made to the following detailed description that should be read in conjunction with the appended drawings as follows:

FIG. 1 is a cross sectional schematic diagram of a CMOS device having gate contacts disposed on isolation regions;

FIG. 2 is a schematic cross sectional device similar to FIG. 1 where a layer of polysilicon has been deposited, patterned and oxidized;

FIG. 3 is a schematic cross section similar to FIG. 2 in which the polysilicon layer is implanted with N and P dopants;

FIG. 4 is a cross sectional schematic similar to FIG. 3 showing silicided local interconnects.

DETAILED DESCRIPTION

Turning to FIG. 1, there is shown partially formed NMOS and PMOS devices. on a P-type substrate 10, a P-well 14 is formed including an N-channel device. The NMOS device includes source and drains 18 that are preferably lightly doped N− and a gate 24 insulated from the top of the substrate 10 by gate oxide layer 22. The gate 24 is formed of non-monocrystalline silicon, either amorphous or polysilicon. Gates 24 and 25 pass over and on top of isolation regions 16. Other gates 8 and 9 extend to adjoining the respective NMOS and PMOS devices disposed beyond isolation regions 16a, 16c. The gates 8 and 9 as well as the gates 24, 25 receive sidewall oxide spacers 26 in a manner well known in the art. During a prior step, not shown, the respective sources and drains 18, 20 of the NMOS and PMOS devices are suitably formed (preferably, lightly doped) through well-known steps of masking and diffusion or implantation.

In a next step, as finally shown in FIG. 2, layer 28 of polysilicon or amorphous silicon is deposited on top of the substrate 10. The layer 28 is patterned and etched to expose a portion of the sources and drains and also portions of the gate contacts. The patterned and etched layer 28 is then oxidized to provide a thin layer 30 on top and sides of layer 28.

Turning to FIG. 3, the respective NMOS and PMOS devices are patterned and implanted. In a typical process, the NMOS devices will be masked with a suitable implant resist, such as photoresist. The exposed PMOS devices will receive a suitable implant of a P-type dopant, for example, boron. Such boron doping will form P+ regions 53, 54 in the sources and drains of the PMOS device as well as dope the exposed non-monocrystalline polysilicon layer 28 and the gate 25.

A similar N doping process will be performed on the NMOS device. The PMOS device will be masked and then a suitable N type implant, for example, phosphorus or arsenic will be implanted into the exposed NMOS regions. As such, N+ regions 51, 52 will be formed in the sources and drains and the exposed portions of layer 28 adjoining the NMOS device and the gate 24 will be suitably N doped.

A siliciding step is shown in FIG. 4. Prior to siliciding, the oxide layer 30 is completely removed thereby exposing the top and side surfaces of layer 28 and the silicon substrate 10 to the siliciding process. The silicon layer 28, the exposed substrate 10, and the exposed top surfaces of gate structures 8, 9, 24, and 25 are reacted with titanium in a dry, inert atmosphere for 25 minutes at 850–900 degrees C. The reaction results in a silicide layer 38 over the exposed amorphous/polysilicon areas and monocrystalline silicon areas. As such, in the final structure as shown in FIG. 4, a titanium silicide interconnect layer 38 and underlying doped silicon layer 34 connect the silicided gate 60 with the source 61 of NMOS transistor 42. The drain 62 of NMOS transistor 42 is coupled to the source 63 of PMOS transistor 44 via an underlying doped silicon layer 35 and an upper silicide layer 37. In the region 39 of layer 35 where opposite doping concentrations meet, there is a possibility of forming a PN junction. However, the problems of such a potential junction can be minimized by adjusting the masking pattern to insure that the dopant concentrations at the junctions are reduced. In any event, the silicide strap 37 across the top of the silicon strap 28 will short the PN junction and otherwise provide a suitable interconnection between drain 62 and source 63. Finally, drain 64 is coupled to another silicided gate 65 via underlying doped polysilicon layer 36 and the topside silicided layer 37.

Those skilled in the art will appreciate that further modifications, additions, and changes may be made to the aforementioned process and structure without departing from the spirit and scope of the invention as disclosed and claimed. Included in these modifications is the option to form the implant to the polysilicon layer 28 after forming the silicide layer 37.

It is a technical advantage of the claimed invention that the techniques of depositing polysilicon, implanting the deposited polysilicon, and siliciding the deposited polysilicon are compatible with existing CMOs process techniques. It is a further advantage of the invention that the foregoing steps can be added to a CMOs device to provide an improved local interconnect without introducing new gate materials, such as molybdenum. It is still a further advantage of the invention that the steps of siliciding the deposited polysilicon layer can be performed simultaneously with the steps of saliciding the source, drain and gate of the insulated gate field effect transistor.

Those skilled in the art will further recognize that the local interconnect layer 37 is substantially thinner than the gate layer 24. As such, the local interconnect layer 37 allows an implant 33, 31 to penetrate the interface 51–54 of source/drain 18, 20 and gate 24, 25 to improve the electrical contact between the local interconnect 37 and the source/drain 18, 20. As such, the improved electrical connection reduces the effects of erosion of the layer underlying the interconnect due to accidental overetch of the local interconnect layer -37. So, the etching of layer 37 is less critical to the operating characteristics of the CMOS devices. These results of enhanced electrical contact are also due to the structural feature of the invention that provides a silicide layer on the sides as well as the top of silicon layer 28. The gates are shielded by oxide spacers 26 from silicide, but layer 28 is not. So, there is a continuity of silicide from the outer surface of the local interconnect 37 to the silicided source/drain 61–64 or to the gate 60, 65. So, electrical conductivity has an unbroken silicide layer from a gate 60 to a source/drain 61 that does not rely on poly-to-poly or poly-to-silicide conductance to achieve a good ohmic contact.

I claim:

1. In a CMOS process, a method for forming a local interconnect, comprising the steps of:

depositing a layer of non-monocrystalline silicon on a source or drain and on a gate contact on an isolation region adjoining said source or drain;

forming a silicide layer on said non-monocrystalline silicon layer; and doping the non-monocrystalline silicon layer.

2. The method of claim 1 wherein a portion of the non-monocrystalline layer in contact with the NMOS devices is n-doped and a portion of the non-monocrystalline layer in contact with the PMOS devices is p-doped.

3. The method of claim 1 wherein the doping of the non-monocrystalline layer occurs after the siliciding.

4. The method of claim 1 wherein the doping of the non-monocrystalline layer occurs before the siliciding.

5. The method of claim 1 wherein the gate contact is doped.

6. The method of claim 1 wherein the step of forming a silicide layer on said non-monocrystalline silicon layer also includes forming a silicide layer on a transistor gate adjoining the source or drain.

7. The method of claim 6 where in the sources and drains are doped before siliciding.

8. The method of claim 6 wherein the sources and drains doped after siliciding.

* * * * *